(12) United States Patent
Agam et al.

(10) Patent No.: US 12,327,741 B2
(45) Date of Patent: Jun. 10, 2025

(54) OSCILLATING SECONDARY STAGE FOR FRAME-MODE OVERLAY METROLOGY

(71) Applicant: KLA Corporation, Milpitas, CA (US)

(72) Inventors: Izhar Agam, Milpitas, CA (US);
Andrew Hill, Milpitas, CA (US);
Yoram Uziel, Milpitas, CA (US);
Amnon Manassen, Milpitas, CA (US);
Daria Negri, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 304 days.

(21) Appl. No.: 18/176,316

(22) Filed: Feb. 28, 2023

(65) Prior Publication Data
US 2024/0290643 A1 Aug. 29, 2024

(51) Int. Cl.
*H01L 21/67* (2006.01)
*H01L 21/683* (2006.01)

(52) U.S. Cl.
CPC .... *H01L 21/67288* (2013.01); *H01L 21/6838* (2013.01)

(58) Field of Classification Search
CPC ........... H01L 21/67288; H01L 21/6838; H01L 21/681; H01L 21/683; G03F 7/70716; G03F 7/70758; G03F 7/70775; G01N 21/9501; G01N 21/8806; G01N 21/892; G01N 21/956; G01B 11/24; G01B 11/303; G01Q 10/02; G01Q 10/04; G06T 2207/30141; G06T 2207/30148; G06T 7/0004; Y10S 977/868; Y10S 977/872
See application file for complete search history.

(56) References Cited

U.S. PATENT DOCUMENTS

| | | | |
|---|---|---|---|
| 5,948,972 A | | 9/1999 | Samsavar et al. |
| 2005/0024621 A1* | | 2/2005 | Korenaga ........... G03F 7/70716 |
| | | | 355/75 |
| 2005/0168076 A1* | | 8/2005 | Hazelton ............. G03F 7/70716 |
| | | | 250/442.11 |
| 2007/0188832 A1* | | 8/2007 | Hayakawa ......... G01N 21/9501 |
| | | | 358/406 |

FOREIGN PATENT DOCUMENTS

| | | |
|---|---|---|
| JP | H09199556 A | 7/1997 |
| JP | 2000081319 A | 3/2000 |
| JP | 2007240519 A | 9/2007 |
| KR | 20140119908 A | 10/2014 |

OTHER PUBLICATIONS

International Search Report and Written Opinion for Application No. PCT/US2024/015662, dated Jun. 12, 2024, 7 pgs.

* cited by examiner

*Primary Examiner* — Jason L Vaughan
*Assistant Examiner* — Amanda Kreiling
(74) *Attorney, Agent, or Firm* — Kwan & Olynick LLP

(57) ABSTRACT

An oscillating secondary stage in a metrology system. The metrology system includes a primary stage configured for long movement to transport a wafer from a one location to another. A secondary stage coupled to the primary stage holds the wafer is configured to oscillate between the first direction and a second direction. The oscillation of the second stage allows for capturing an image frame of the wafer at a target location while the primary stage is moving.

20 Claims, 11 Drawing Sheets

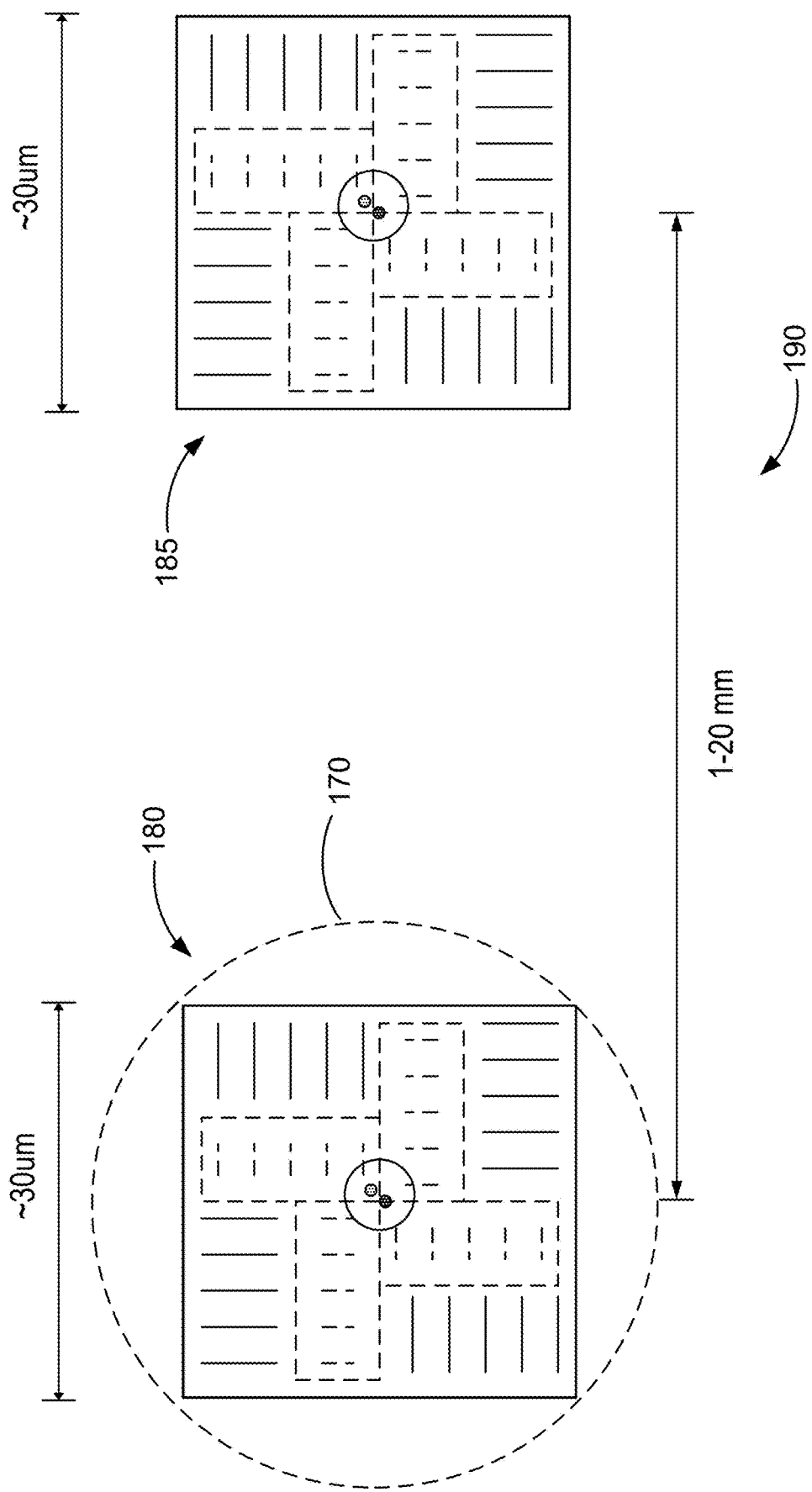

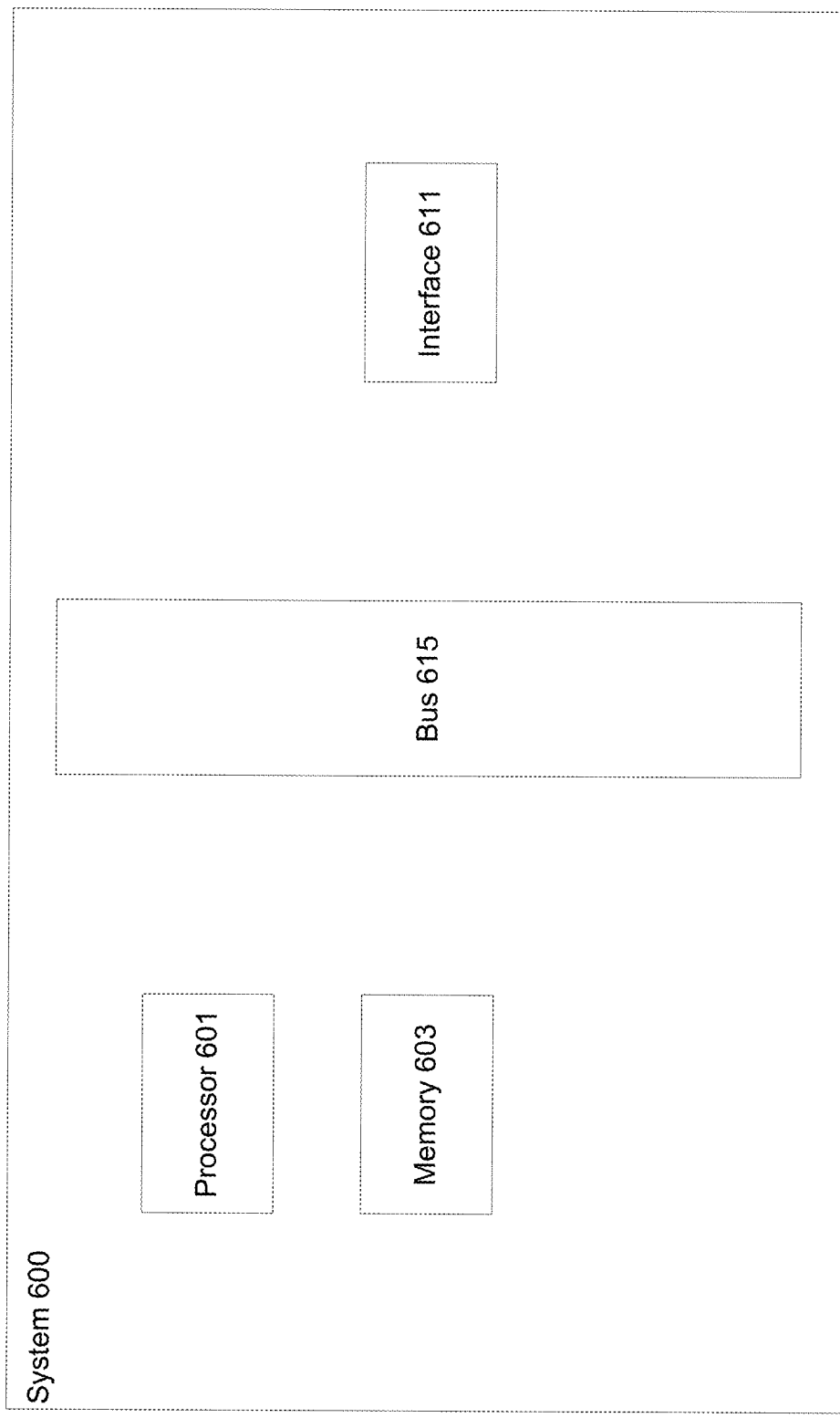

OSCILLATING SECONDARY STAGE FOR FRAME-MODE OVERLAY METROLOGY

TECHNICAL FIELD

The disclosure generally relates to the field of wafer inspection systems. More particularly the present disclosure relates to frame-mode metrology.

BACKGROUND

Generally, the industry of semiconductor manufacturing involves highly complex techniques for fabricating integrated circuits using semiconductor materials which are layered and patterned onto a substrate, such as silicon. Due to the large scale of circuit integration and the decreasing size of semiconductor devices, the fabricated devices have become increasingly sensitive to defects. That is, defects which cause faults in the device are becoming increasingly smaller. The device needs to be generally fault free prior to shipment to the end users or customers.

With frame-mode metrology, one wafer can have tens, hundreds, or even thousands of overlay targets that need to be measured. Currently, only one target is measured at a time. Because the distance between targets can be significant, current systems utilize a moving stage that moves from one target to another, sequentially. Each move requires time for the stage to travel from one target to the next. In addition, because each move requires an acceleration from the stop position and a deceleration to the stop position on the next target, there is an additional waiting time before a measurement can be taken. Further, current systems also need to account for extra time to allow for the vibrations in the system to settle. Thus, there is significant lag time between measurements mainly due acceleration and deceleration of the stage combined with settling time. Thus, there is a need for an improved metrology system that reduces the time in-between measurements.

SUMMARY

The following presents a simplified summary of the disclosure in order to provide a basic understanding of certain embodiments of the disclosure. This summary is not an extensive overview of the disclosure and it does not identify key/critical elements of the disclosure or delineate the scope of the disclosure. Its sole purpose is to present some concepts disclosed herein in a simplified form as a prelude to the more detailed description that is presented later.

One aspect of the present disclosure is directed to a system. The system includes a stage base and a primary stage coupled to the stage base. The primary stage is configured for long travel and moving a wafer from a first location to a target location in a first direction. The system also includes a secondary stage coupled to the primary stage. The secondary stage is configured for oscillating movements and moving the wafer in a second direction opposite of the first direction as the wafer approaches the target location such that an image frame can be captured on the wafer at the target location while the primary stage is moving. Last, the system includes a wafer holding mechanism configured to hold the wafer in place during movement of the primary and secondary stages.

In some embodiments, the secondary stage accelerates in both the first direction and the second direction. In some embodiments, the primary stage accelerates and decelerates in the first direction. In some embodiments, the wafer holding mechanism includes a vacuum chuck. In some embodiments, the primary stage moves at a constant velocity during the image frame capture. In some embodiments, the secondary stage is further configured to accelerate in the first direction after the image frame capture. In some embodiments, positions of the secondary and primary stages are monitored using a position feedback mechanism.

Other aspects of the present disclosure are directed to a method and a non-transitory computer readable medium storing instructions to execute the method. The method includes first moving a primary stage in a first direction relative to a stage base from a first location to a target location. The primary stage is coupled to a secondary stage and the secondary stage is configured to hold a wafer via a wafer holding mechanism. Next, the method includes moving the secondary stage in a second direction opposite of the first direction as the wafer approaches the target location. Last, the method includes capturing an image frame on the wafer at the target location while the primary stage is moving.

In some embodiments, the method further includes accelerating the secondary stage in both the first direction and the second direction. In some embodiments, the method further includes accelerating and decelerating the primary stage in the first direction. In some embodiments, the wafer holding mechanism includes a vacuum chuck. In some embodiments, the primary stage moves at a constant velocity during the image frame capture. In some embodiments, the method further includes accelerating in the first direction after the image frame is captured. In some embodiments, the method further includes monitoring positions of the secondary and primary stages using a position feedback mechanism.

These and other aspects of the disclosure are described further below with reference to the figures.

BRIEF DESCRIPTION OF THE DRAWINGS

FIG. 1C illustrates an example of the distance between two targets in wafer, in accordance with embodiments of the present disclosure.

FIG. 6 illustrates an example of a computer system, in accordance embodiments of the present disclosure.

DETAILED DESCRIPTION OF EXAMPLE EMBODIMENTS

In the following description, numerous specific details are set forth in order to provide a thorough understanding of the present disclosure. The present disclosure may be practiced without some or all of these specific details. In other instances, well known process operations have not been described in detail to not unnecessarily obscure the present disclosure. While the disclosure will be described in conjunction with the specific embodiments, it will be understood that it is not intended to limit the disclosure to the embodiments.

In scanning systems, one of the main purposes is to search for defects. Thus, the system must scan the entire surface of the wafer. Meaning, signals must be collected from the entirety of a large area (entire surface of the wafer). In frame-mode systems, only discrete points on the wafer need to be measured. In other words, scanning is amenable when the system has to gather nonstop information, whereas frame mode works well when the system only needs to capture discrete points. This affects how systems can utilize motion in systems. In scanning, since the entire wafer needs to be scanned, the wafer will need to move at a very slow, constant velocity. By contrast, frame-mode systems only care about capturing discrete points that are relatively far away from each other. Thus, using a slow, constant velocity would be inefficient. Instead, frame-mode systems can take advantage of acceleration and deceleration to move the wafer quicker from one target to the next. However, because the velocity is constantly changing, clear images cannot be captured because inertia causes the particles to vibrate when the wafer decelerates. The vibrations need to settle before an image can be captured, which takes time. Thus, moving from one target to another requires wait time for the move and for the settling time.

As mentioned above, in overlay metrology systems, there can be thousands of overlay targets on each wafer, with each target being measured one at a time. In many systems, a stage moves from target to target, sequentially, with each move requiring an acceleration from a stop position and a deceleration to another stop position on the next target. Therefore, each target new target requires new moving time and new settling time. With potentially thousands of targets, the settling time really adds up, leading to significant delays overall. Since the time to actually capture the image once the wafer has reached its next destination is relatively short compared to that of the time it takes for the wafer to move to the next destination, then reducing the overall time of move from target to target will lead to increased throughput. Because increasing throughput is a major goal in making metrology systems more efficient, the techniques and mechanisms of the present disclosure solve this issue by significantly reducing the time in between image capture of two adjacent targets.

Figure 1A:
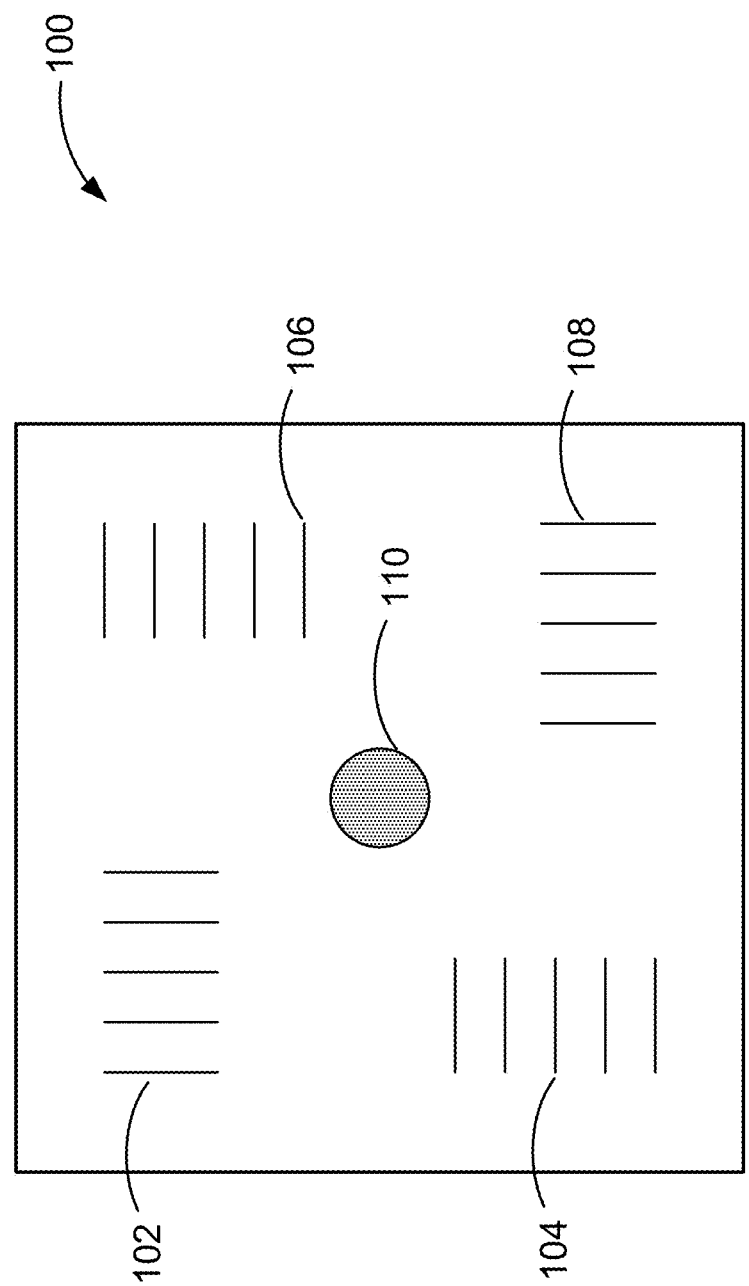
FIG. 1A illustrates an example layer in a wafer, in accordance with embodiments of the present disclosure.

In order to better understand the techniques and mechanisms of the present disclosure, a description of a target is provided below. As previously mentioned, targets for frame mode image capture are discrete point locations on a wafer. According to various embodiments, a wafer is comprised of many different layers. FIG. 1A illustrates an example of just one layer in a wafer, in accordance with embodiments of the present disclosure. Process layer 100, as shown in FIG. 1A, includes four grading cells, 102, 104, 106, and 108. Process layer 100 also includes an XY centroid 110 in process layer 100. XY centroid 110 forms part of an overlay target in a wafer, as shown in FIG. 1B.

Figure 1B:
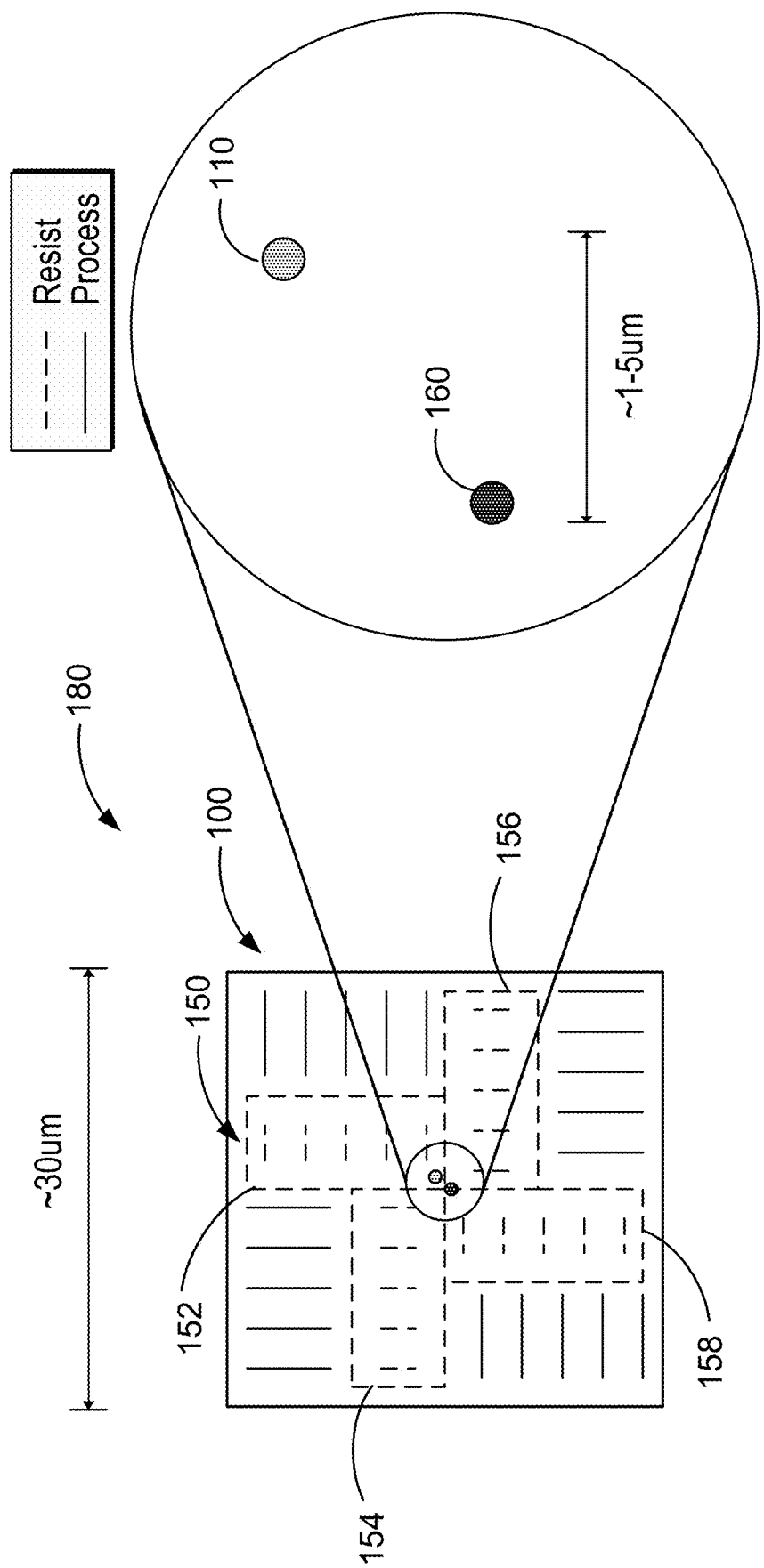
FIG. 1B illustrates an example of a target in wafer, in accordance with embodiments of the present disclosure.

FIG. 1B illustrates an example of a target in a wafer, in accordance with embodiments of the present disclosure. According to various embodiments, target 180 comprises a second layer, e.g., a resist layer 150 (as shown in FIG. 1B), overlayed on top of the first process layer 100. Similar to process layer 100, resist layer 150 also includes four grading cells, 152, 154, 156, and 158. However, in some embodiments, grading cells 152, 154, 156, and 158 are printed over grading layers 102, 104, 106, and 108 in an offset, pinwheel-like manner as illustrated in FIG. 1B. In addition, resist layer 150 also includes an XY centroid 160. According to various embodiments, a purpose for capturing an image of target 180 is to determine the distance/differential between two centroids, e.g., centroid 160 and centroid 110, in vertically adjacent layers. In some embodiments, this distance is on the order of several microns, e.g. 1-5 um. In some embodiments, target itself is around on the order of tens of microns, e.g., 30 um. By contrast, the next adjacent target may be millimeters away. FIG. 1C illustrates one example of a distance 190 between two adjacent targets 180 and 185. In some embodiments, the stage moves the wafer until a target is positioned precisely within a field of view 170 for image capturing. In some embodiments, field of view 170 is the field of view of a microscope.

Figure 2:
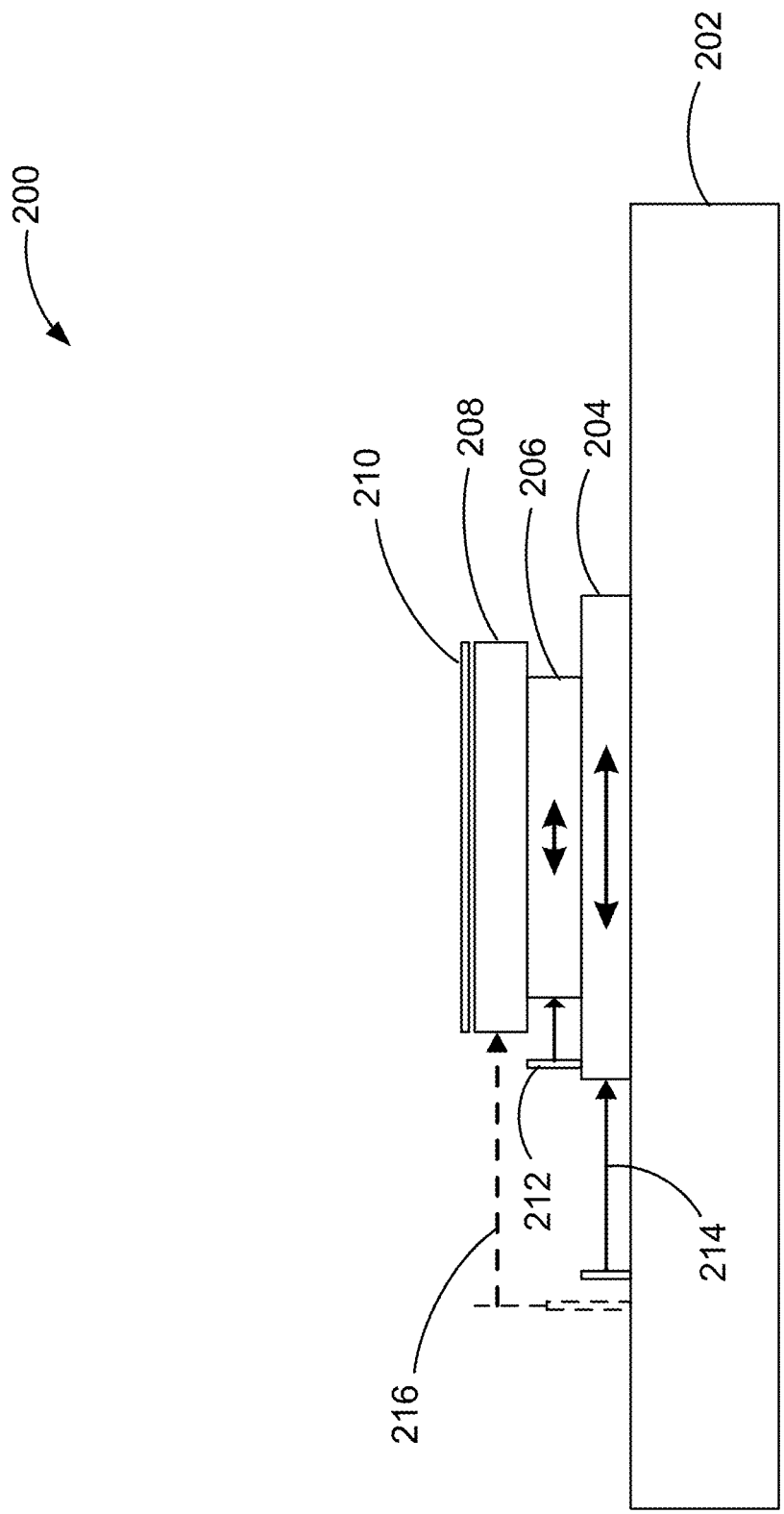
FIG. 2 shows a side view of an example wafer carrier, in accordance with embodiments of the present disclosure.

As previously mentioned, acceleration and deceleration of the wafer via a primary stage requires settling time in order for the vibrations to stop before an image frame can be captured. However, the techniques and mechanisms of the present disclosure provide for a method to reduce or remove settling time by utilizing a secondary stage that moves in an opposite, but equal, direction as the primary stage in order for the stage to "stay still" for image capturing. FIG. 2 shows a side view of an example wafer carrier, in accordance with embodiments of the present disclosure.

FIG. 2 illustrates a wafer carrier 200. According to various embodiments, wafer carrier 200 includes a stage base 202. In some embodiments, stage base 202 does not move. In some embodiments, stage base 202 comprises stage granite. According to various embodiments, on top of stage base 202 sits primary stage 204. In some embodiments, primary stage 204 is a dual axis long travel stage. In other embodiments, primary stage 204 is a single axis long travel stage. In some embodiments, primary stage 204 is primarily responsible for moving wafer 210 from one target to another. In some embodiments, because the distance between two targets is relatively long compared to the width of a target itself, primary stage 204 is configured to accelerate to a top velocity when leaving a first target location and decelerate when approaching a next target location. That way, primary stage 204 can minimize the travel time between two targets.

According to various embodiments, wafer carrier 200 also includes secondary stage 206. According to various embodiments, secondary stage 206 is configured to move in a direction that is opposite of the direction of movement of the primary stage in order to cause the wafer to come to a complete "stop," thereby allowing an image frame to be captured. In some embodiments, because secondary stage 206 accelerates until it reaches a constant velocity that is equal and opposite to the velocity of the primary stage around the target location, the wafer comes to a complete stop, and an image frame can be captured without needing to wait for particles to settle. This is because there is no deceleration of the wafer to a complete stop. Consequently, primary stage 204 does not need to stop moving in order for the system to capture an image. The advantage of this configuration of wafer carrier 200 is that settling time is eliminated, or at least reduced to a minimum, and primary stage 204 does not need to begin movement from a complete stop. Beginning movement from a complete stop requires a lot of acceleration and power because of inertia. Since primary stage 204 never stops moving, even when an image frame is being captured, the system requires less power, less acceleration, and less time, to overcome the inertia of the wafer carrier system. In some embodiments, secondary stage 206 is a single axis stage configured to move in the same or opposite direction of primary stage 204. In other embodiments, secondary stage 206 is a dual axis stage configured to move in both the X and Y directions. In some embodiments, wafer 210 is held onto secondary stage 206 via a wafer holding mechanism 208. In some embodiments, wafer holding mechanism 208 includes a vacuum chuck to make sure wafer 210 does not move relative to secondary stage 206, even while secondary stage 206 accelerates in a direction opposite to that of the direction of movement of primary stage 204.

According to various embodiments, both primary stage 204 and secondary stage 206 move via a combination of motors, bearings, controllers, and encoders. In some embodiments, each stage has an encoder 212 or 214 to help identify the position of the stage. In some embodiments, instead of, or in addition to, an encoder on each stage, wafer carrier includes a common position feedback mechanism 216, e.g., an interferometer, for wafer 210. In some embodiments, position feedback mechanism 216 is a single metrology, e.g. a glass scale sensor, on the wafer against stage base 202. In some embodiments, a glass encoder includes a piece of glass with grading lines on it. In such embodiments, a light is shined on the grading and a sensor on the backside counts the lines as the stage passes by. In some embodiments, the position feedback is on the order of nanometers.

In some embodiments, encoder 212 is separate metrology against primary stage 204. Various different types of metrology can be used. In some embodiments, encoders can be positioned relative to any of the stages. For example, encoder 212 can be a position sensor of secondary stage 206 relative to either primary stage 204 or stage base 202. In some embodiments, encoder 214 can be a position sensor on primary stage 204 relative on stage base 202. In addition, encoder 216 can be a position sensor on wafer 210 relative to any of secondary stage 208, primary stage 204, or stage base 202. This is because the system needs to know where the wafer is moving. In some embodiments, the bearings for the stages could be air bearings, magnetic levitation, ball bearings, roller bearings, or flexor bearings.

In some embodiments, secondary stage 206 oscillates between the direction of travel of primary stage 204 and the opposite direction. In such embodiments, secondary stage 206 accelerates back into its starting position on the acceleration. In other embodiments, secondary stage 206 only moves in one direction, which is opposite to the direction of travel of primary stage 204. In some embodiments, secondary stage 206 is configured to accelerate to a velocity that is equal and opposite of primary stage 204. In some embodiments, secondary stage 206 is configured to accelerate to a velocity opposite but less of the velocity of primary stage 204 such that wafer 210 appears to be moving at a constant velocity that is less than the velocity of primary stage 204. In such embodiments, the slower constant velocity may be amenable for other purposes, such as wafer scanning.

According to various embodiments, second stage 206 oscillates with the shortest stroke possible. FIGS. 3A-3F are graphs that illustrate examples of the accelerations, velocities, and distances of the primary and secondary stages. In some embodiments, each axis of the stage is approximately 300 mm of travel because wafers are typically 300 mm in size. In some embodiments, each wafer is capable of 1-2 Gs of acceleration. As used herein, RMS stands for "root mean square," which functions as the maximum of a value, e.g., the maximum velocity.

In some embodiments, the system utilizes short travel secondary stages on top of long travel primary stages in order to apply an equal and opposite velocity vector to bring the wafer to a complete stop at the target. In some embodiments, the long travel primary stage does not stop, even during image frame capture.

Figure 3A:
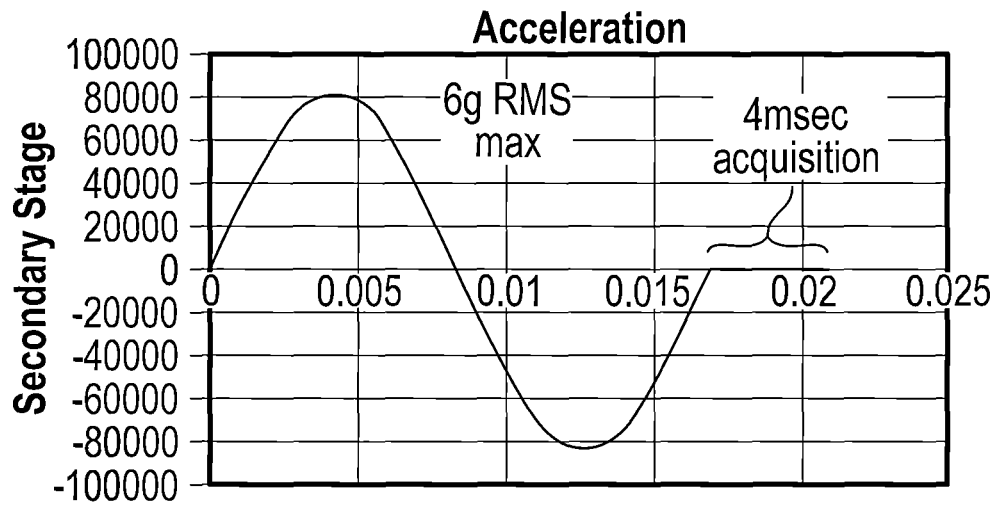
FIGS. 3A-3F are graphs illustrating example accelerations, velocities, and distances of stages, in accordance with embodiments of the present disclosure.
Figure 3B:
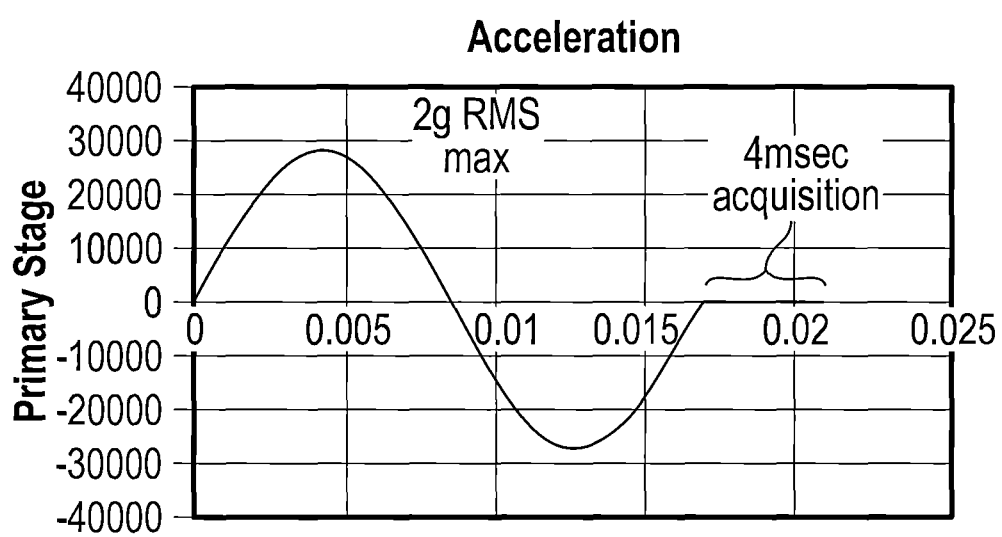

FIG. 3B shows the acceleration of the primary stage from one target to the next. FIG. 3B begins at a target point where the image frame has just been captured. FIG. 3B then illustrates the primary stage first accelerating to a maximum velocity, and then decelerating to a constant velocity (shown to be 180 mm/s, as shown in FIG. 3D, which is the constant velocity during image acquisition). As shown in FIG. 3B, the primary stage reaches a maximum acceleration of 2 G RMS.

According to various embodiments, on top of the primary stage sits the secondary stage. As with the FIG. 3B. at the start of the graph, the system has just completed the image capture of the wafer at the last target and is on the move toward the next target. Since the secondary stage was actually traveling at an equal but opposite velocity relative to the primary stage during acquisition (meaning the secondary stage appears "still" relative to the stage base), the secondary stage also needs to move back into its initial starting position relative to the primary stage before accelerating again in the opposite direction relative to the primary stage (effectively decelerating relative to the stage base) to start the next capture movement. Thus, in order to get back into its initial position relative to the primary stage, the secondary stage needs to first accelerate in the same direction relative to the primary stage. Since the primary stage is already accelerating, as shown in FIG. 3B, the secondary stage needs to accelerate faster than the primary stage. Thus, secondary stage reaches a maximum acceleration of 6 G RMS. When the secondary stage has returned to its initial starting position, the secondary stage can begin to move in the opposite direction relative to the movement of the primary stage in preparation for the next image frame acquisition at the next target. Thus, from the perspective of the non-moving stage base, secondary stage starts decelerating until it reaches a constant velocity relative to the primary stage. When the secondary stage reaches an opposite yet equal velocity relative to the velocity of the primary stage, the secondary stage appears to be "still" from the perspective of the stage base, which is the perspective of the image capturing field of view. Once the secondary stage appears to be non-moving from the stage base perspective (meaning traveling in the opposite direction at a constant velocity relative to the primary stage), the image is captured. As shown in both FIGS. 3A and 3B, an example acquisition duration of time can be 4 ms long.

Figure 3C:
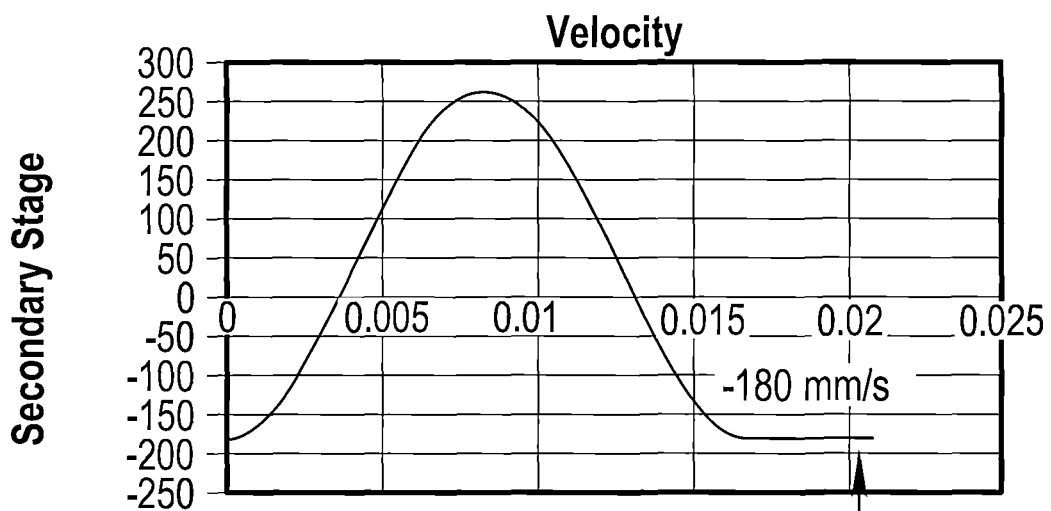
Figure 3D:
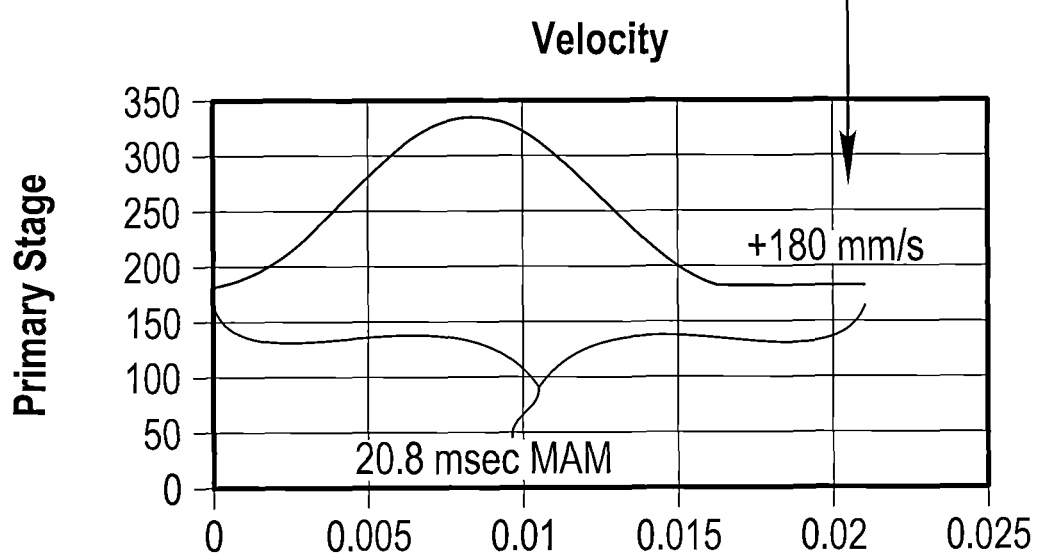

FIGS. 3C and 3D are graphs showing velocities of the primary and secondary stages during the same period of time. As shown in FIG. 3C, the secondary stage is first moving at a constant negative velocity of −180 mm/s, which is the velocity during the image capture. As the secondary stage begins to move back into its initial position, the velocity increases until it reaches its initial position. Then, as the secondary stage approaches the next target, it starts to decelerate and continues to decelerate until it reaches the −180 mm/s once again for the next image capture. By contrast, as shown in FIG. 3D, primary stage starts at a constant positive velocity of 180 mm/s. During the move portion of the phase, primary stage reaches a maximum velocity, e.g., 300 mm/s (meaning a RMS of around 250 mm/s), and then reduces its speed to 180 mm/s once again during the next image capture. The main point is to have the primary stage to be 180 mm/s and the secondary stage to be −180 mm/s. In some embodiments, any constant velocities can be used as long as they are equal and opposite to each other. It should be noted that a single cycle is referred to as a "move and measure" (MAM) cycle. In some embodiments, an example MAM cycle takes 20.8 s. It should be noted that if the system was capable of handling higher acceleration (3+ Gs), then graphs in FIGS. 3C and 3D would be shifted up.

Figure 3E:
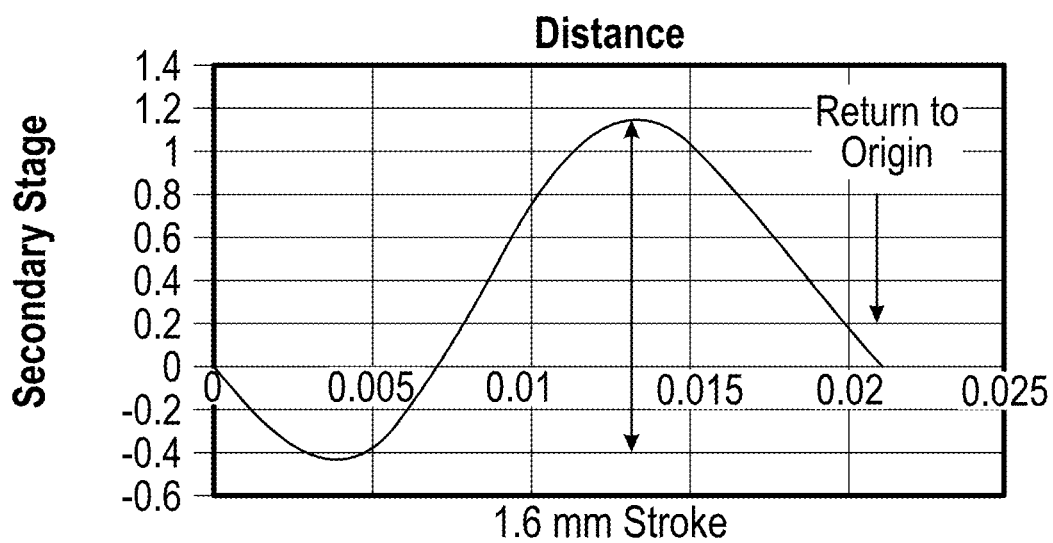
Figure 3F:
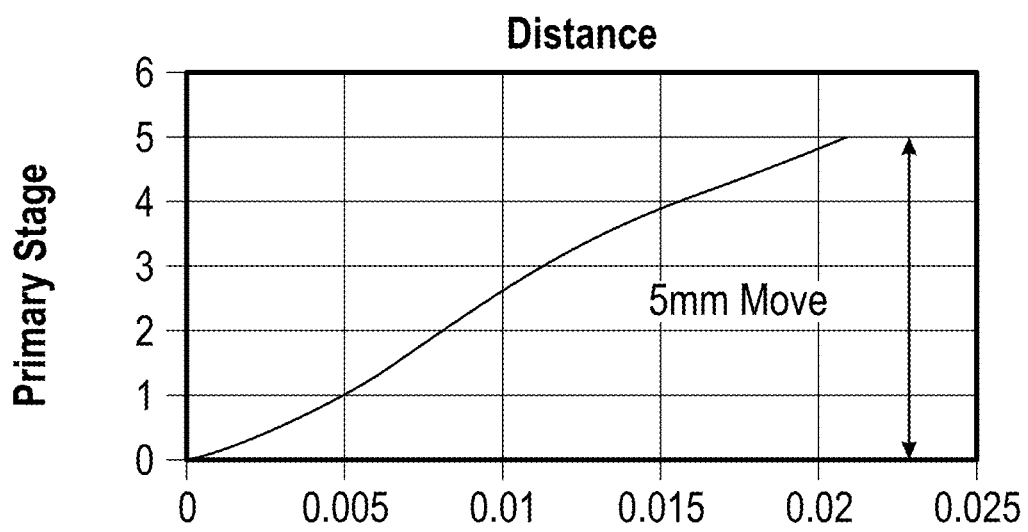

FIGS. 3E and 3F show distances traveled during the MAM cycle. As shown in FIG. 3F, the total distance traveled is 5 mm. This is because in this example, the targets are spaced 5 mm apart. Since the primary stage moves in a single direction, the graph shown in FIG. 3F is relatively simple. However, the graph in FIG. 3E is another story. Since the secondary stage needs to start and stop at exactly the same point relative to the primary stage, the secondary stage needs to oscillate and needs to return back to where it started, the initial position on the primary stage, because the secondary stage needs repeat the cycle for the next target. As shown in FIG. 3F the oscillating stroke of the secondary stage covers a total of 1.6 mm. It should be noted that the distance covered during the MAM cycle is an asymmetric sinusoidal curve due to the fact that there is a 4 ms image capture time. Thus, as shown in FIG. 3E, during the initial capture (which takes 4 ms), the secondary stage travels a negative distance relative to the primary stage. Then, after the image capture duration, the secondary stage starts moving back towards its initial position. Once secondary stage has reached its initial position (the apex of the graph), it starts moving in the negative direction again until it reaches the start of the next cycle.

In some embodiments, instead of oscillating back into the initial position, secondary stage simply stops moving in the direction opposite of the primary stage. In such embodiments, as the secondary stage approaches the next target, the secondary stage starts moving again in the opposite direction to make the wafer appear "still." In such embodiments, the secondary stage accumulates travel, which may require a larger primary stage.

In some embodiments, primary stage can have constant or varying velocities during the image capture duration. Embodiments using a constant velocity during image capture requires a constant opposing velocity of the secondary stage during the image capture process. However, in embodiments using a varying velocity during the image capture process, the secondary stage needs to varying its own velocity in an exact opposite pattern as the primary stage.

In some embodiments, acceleration and deceleration are sinusoidal, as shown in FIGS. 3A and 3B. In some embodiments, the acceleration profiles do not need to be sinusoidal. However, sinusoidal acceleration and deceleration profiles are easier to work with because the system can operate on a single frequency. In other words, a controller can be configured to give one frequency of excitation to the system to make it work.

Figure 4A:
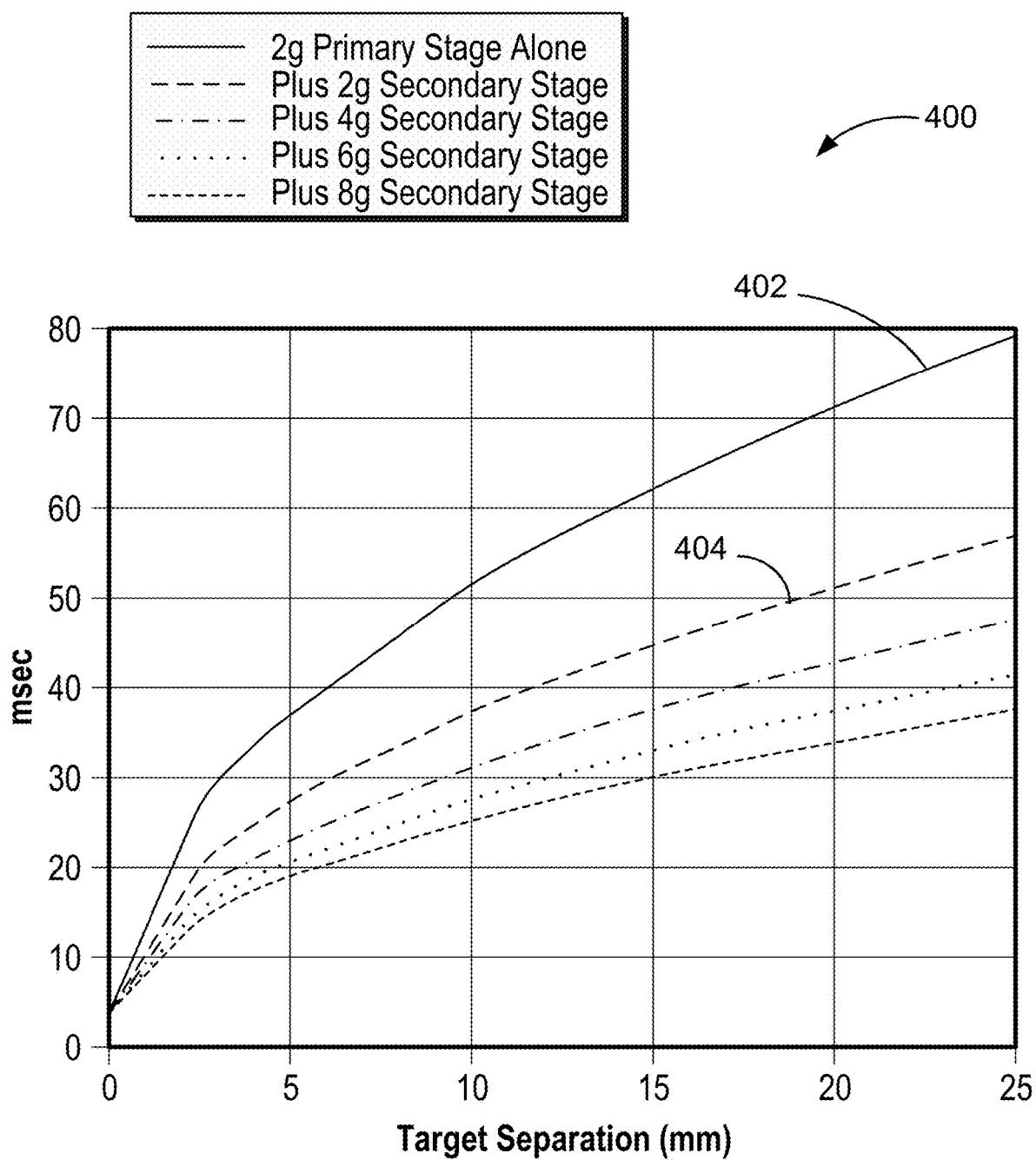
FIG. 4A is a graph showing various times to move between targets, in accordance with embodiments of the present disclosure.

FIG. 4A is a graph that shows various durations of time to move from one target to the next (aka MAM time). Graph 400 illustrates various embodiments and their respective times. For example, curve 402 shows the time duration for a standard primary stage accelerating at 2 G RMS, without using a second oscillating stage. As shown in FIG. 4A, the MAM time to move 5 mm with only a primary stage is approximately 38 ms. Additionally, curve 402 shows the MAM time to move 10 mm with only a primary stage is approximately 52 ms. By contrast, curve 404 shows the MAM time to move 5 mm with a primary stage and a 2 G RMS accelerating secondary stage is approximately 28 ms, and the MAM time to move 10 mm is approximately 38 ms. In general, graph 400 shows the faster the RMS acceleration of the secondary stage, the smaller the MAM time between two targets.

Figure 4B:
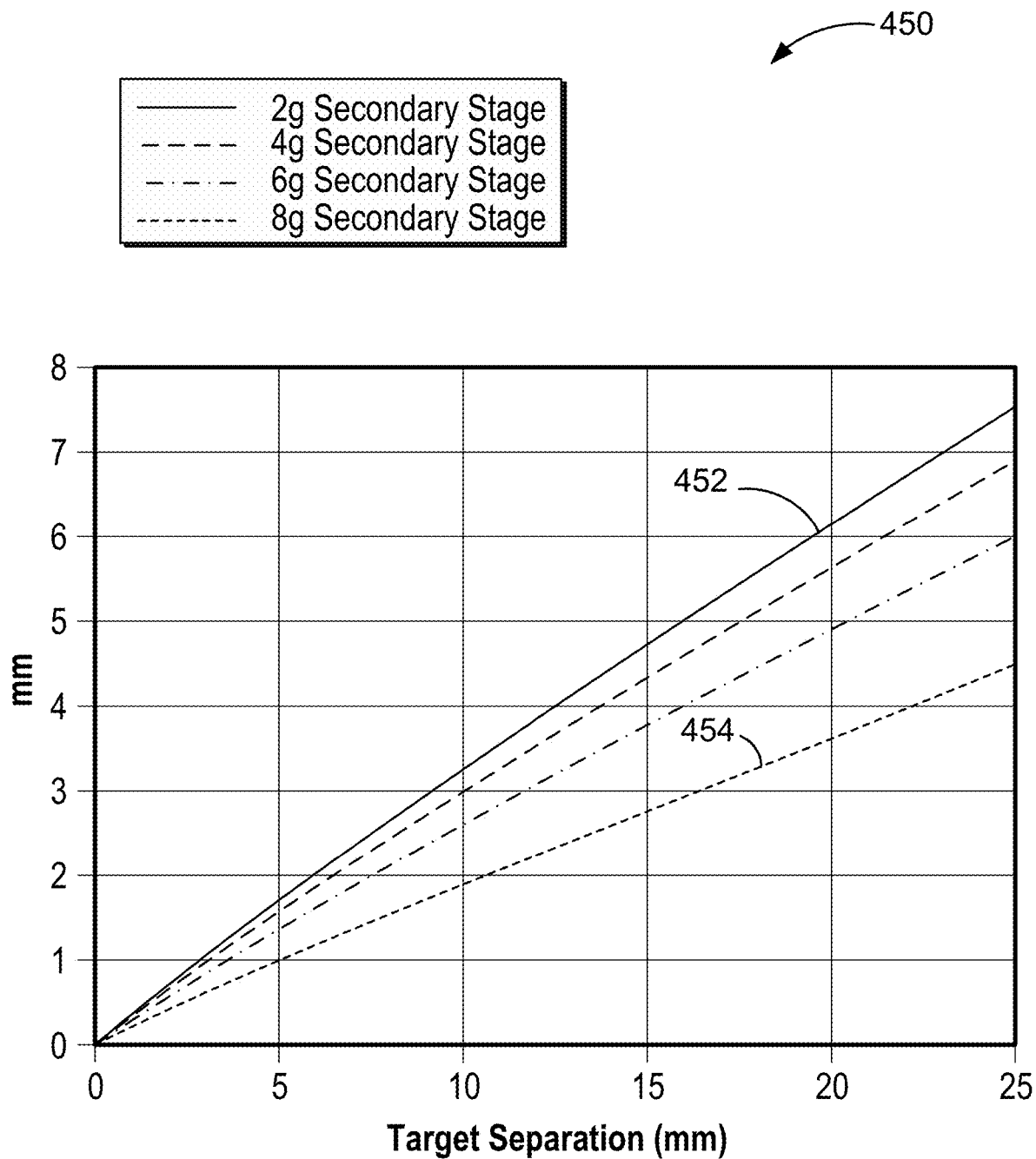
FIG. 4B is a graph showing various distances traveled between targets, in accordance with embodiments of the present disclosure.

FIG. 4B is a graph showing distances traveled by the secondary stage with various RMS values of acceleration. With each of the curves in graph 450, the primary stage has a maximum acceleration of 2 Gs RMS. In addition, with each curve, the movement profiles of the secondary stage is single frequency sinusoidal with a 4 ms image capture duration. As shown in FIG. 4B, curve 452 shows the distance traveled by the secondary stage accelerating at 2 Gs RMS with 5 mm target separation is approximately 1.8 mm. By contrast, curve 454 shows the distance traveled by the secondary stage accelerating at 8 Gs RMS with 5 mm target separation is approximately 1 mm. In general, graph 450 shows the faster the RMS acceleration of the secondary stage, the less distance the secondary stage needs to travel during an oscillation.

Figure 5:
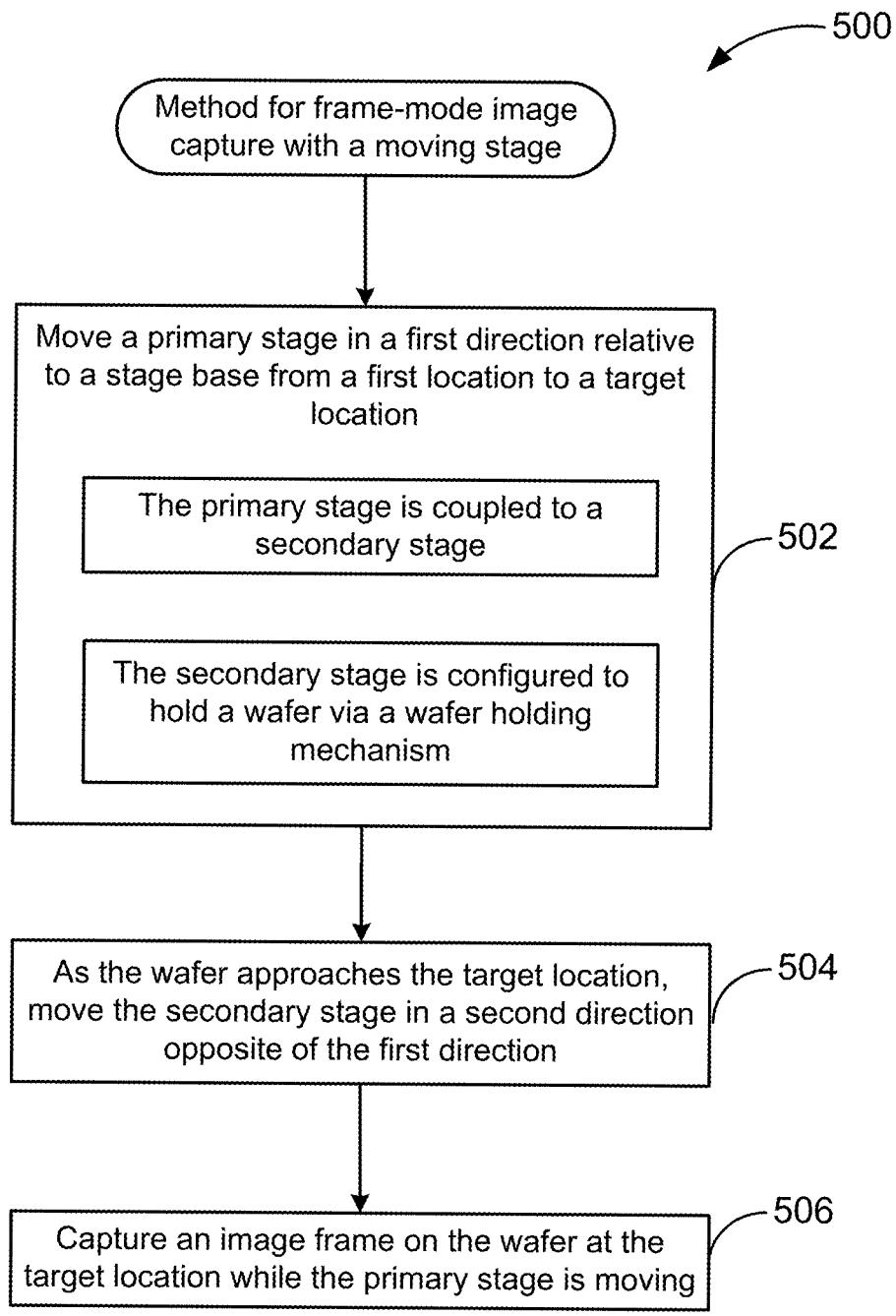
FIG. 5 is a flow diagram showing a method, in accordance embodiments of the present disclosure.

FIG. 5 is a flow diagram showing a method for frame-mode image capture with a moving stage, in accordance embodiments of the present disclosure. Method 500 begins with moving (502) a primary stage in a first direction relative to a stage base from a first location to a target location. In some embodiments, the primary stage is coupled to the secondary stage. In some embodiments, the secondary stage is configured to hold a wafer via a wafer holding mechanism. Then, as the wafer approaches the target location, the secondary stage moves (504) in a second direction opposite of the first direction. Last, an image frame is captured (506) on the wafer at the target location while the primary stage is moving.

In some embodiments, the method further includes accelerating the secondary stage in both the first direction and the second direction. In some embodiments, the method further includes accelerating and decelerating the primary stage in the first direction. In some embodiments, the wafer holding mechanism includes a vacuum chuck. In some embodiments, the primary stage moves at a constant velocity during the image frame capture. In some embodiments, the method further includes accelerating in the first direction after the image frame is captured. In some embodiments, the method further includes monitoring positions of the secondary and primary stages using a position feedback mechanism.

FIG. 6 illustrates one example of a computer system, in accordance with embodiments of the present disclosure. According to particular embodiments, a system 600 suitable for implementing particular embodiments of the present disclosure includes a processor 601, a memory 603, an interface 611, and a bus 615 (e.g., a PCI bus or other interconnection fabric). When acting under the control of appropriate software or firmware, the processor 601 is responsible for implementing applications such as an operating system kernel, a containerized storage driver, and one or more applications. Various specially configured devices can also be used in place of a processor 601 or in addition to processor 601. The interface 611 is typically configured to send and receive data packets or data segments over a network.

Particular examples of interfaces supported include Ethernet interfaces, frame relay interfaces, cable interfaces, DSL interfaces, token ring interfaces, and the like. In addition, various very high-speed interfaces may be provided such as fast Ethernet interfaces, Gigabit Ethernet interfaces, ATM interfaces, HSSI interfaces, POS interfaces, FDDI interfaces and the like. Generally, these interfaces may include ports appropriate for communication with the appropriate media. In some cases, they may also include an independent processor and, in some instances, volatile RAM. The independent processors may control communications-intensive tasks such as packet switching, media control and management.

According to various embodiments, the system 600 is a computer system configured to run a metrology system, as shown herein. In some embodiments, processor 601 is configured to perform all steps in the methods described above, as well as any function or process described above or necessary to implement the processes described above. In some implementations, one or more of the computer components may be virtualized. For example, a physical server may be configured in a localized or cloud environment. The physical server may implement one or more virtual server environments in which the electronics scanning system is executed. Although a particular computer system is described, it should be recognized that a variety of alternative configurations are possible. For example, the modules may be implemented on another device connected to the computer system.

Certain embodiments of the present disclosure presented here generally address the field of semiconductor inspection and process control, and are not limited to the hardware, algorithm/software implementations and architectures, and use cases summarized above.

Although the foregoing disclosure has been described in some detail for purposes of clarity of understanding, it will be apparent that certain changes and modifications may be practiced within the scope of the appended claims. It should be noted that there are many alternative ways of implementing the processes, systems, and apparatus of the present disclosure. Accordingly, the present embodiments are to be considered as illustrative and not restrictive, and the disclosure is not to be limited to the details given herein.

What is claimed is:

1. A system comprising:
   a stage base;
   a primary stage coupled to the stage base, the primary stage configured for long travel and moving a wafer from a first location to a target location in a first direction;
   a secondary stage coupled to the primary stage, the secondary stage configured for oscillating movements and moving the wafer in a second direction opposite of the first direction as the wafer approaches the target location such that an image frame can be captured on the wafer at the target location while the primary stage is moving; and
   a wafer holding mechanism configured to hold the wafer in place during movement of the primary and secondary stages.

2. The system of claim 1, wherein the secondary stage accelerates in both the first direction and the second direction.

3. The system of claim 1, wherein the primary stage accelerates and decelerates in the first direction.

4. The system of claim 1, wherein the wafer holding mechanism includes a vacuum chuck.

5. The system of claim 1, wherein the primary stage moves at a constant velocity during the image frame capture.

6. The system of claim 1, wherein the secondary stage is further configured to accelerate in the first direction after the image frame capture.

7. The system of claim 1, wherein positions of the secondary and primary stages are monitored using a position feedback mechanism.

8. A method comprising:
   moving a primary stage in a first direction relative to a stage base from a first location to a target location, the primary stage being coupled to a secondary stage, the secondary stage configured to hold a wafer via a wafer holding mechanism;
   as the wafer approaches the target location, moving the secondary stage in a second direction opposite of the first direction; and
   capturing an image frame on the wafer at the target location while the primary stage is moving.

9. The method of claim 8, further comprising accelerating the secondary stage in both the first direction and the second direction.

10. The method of claim 8, further comprising accelerating and decelerating the primary stage in the first direction.

11. The method of claim 8, wherein the wafer holding mechanism includes a vacuum chuck.

12. The method of claim 8, wherein the primary stage moves at a constant velocity during the image frame capture.

13. The method of claim 8, further comprising accelerating in the first direction after the image frame is captured.

14. The method of claim 8, further comprising monitoring positions of the secondary and primary stages using a position feedback mechanism.

15. A non-transitory computer readable medium storing instructions to cause a computer processor to execute a method, the method comprising:
   moving a primary stage in a first direction relative to a stage base from a first location to a target location, the primary stage being coupled to a secondary stage, the secondary stage configured to hold a wafer via a wafer holding mechanism;
   as the wafer approaches the target location, moving the secondary stage in a second direction opposite of the first direction; and
   capturing an image frame on the wafer at the target location while the primary stage is moving.

16. The non-transitory computer readable medium of claim 15, further comprising accelerating the secondary stage in both the first direction and the second direction.

17. The non-transitory computer readable medium of claim 15, further comprising accelerating and decelerating the primary stage in the first direction.

18. The non-transitory computer readable medium of claim 15, wherein the wafer holding mechanism includes a vacuum chuck.

19. The non-transitory computer readable medium of claim 15, wherein the primary stage moves at a constant velocity during the image frame capture.

20. The non-transitory computer readable medium of claim 15, further comprising accelerating in the first direction after the image frame is captured.

* * * * *